United States Patent [19]

Duong et al.

[11] Patent Number: 5,511,235
[45] Date of Patent: Apr. 23, 1996

[54] APPARATUS FOR DETECTING A SIGNALING CHANNEL DURING SCANNING INCLUDING A CONTROLLED FREQUENCY CONVERTER CIRCUIT AND A CONTROLLED FILTER BANDWIDTH, AND A METHOD THEREFOR

[75] Inventors: Minh H. Duong, Skokie; Donald A. Dorsey, Vernon Hills; Robert M. Johnson, Jr., Lake Zurich, all of Ill.

[73] Assignee: Motorola, Inc., Schaumburg, Ill.

[21] Appl. No.: 236,736

[22] Filed: May 2, 1994

[51] Int. Cl.⁶ .................................................. H04B 1/40
[52] U.S. Cl. ........................ 455/75; 455/76; 455/87; 455/161.2; 455/164.2; 455/197.1; 455/265; 455/266
[58] Field of Search ................... 455/71, 76–77, 455/84–87, 161.2, 161.3, 197.1, 260, 265, 266, 164.1, 164.2, 343

[56] References Cited

U.S. PATENT DOCUMENTS

| | | |
|---|---|---|
| 4,352,208 | 9/1982 | Schroeder ........................... 455/266 |
| 4,563,651 | 1/1986 | Ohta et al. ......................... 455/266 |
| 4,703,520 | 10/1987 | Rozanski, Jr. et al. ............. 455/76 |
| 4,977,611 | 12/1990 | Maru ................................. 455/161.3 |
| 5,230,086 | 7/1993 | Saul .................................. 455/71 |
| 5,257,400 | 10/1993 | Yoshida ........................... 455/161.2 |
| 5,335,364 | 8/1994 | Heinonen ......................... 455/265 |

FOREIGN PATENT DOCUMENTS 0314028  12/1988  Japan ................................. 455/266

Primary Examiner—Andrew I. Faile
Attorney, Agent, or Firm—Randall S. Vaas

[57] ABSTRACT

A receiver has a channel scan mode of operation and a communication mode of operation. In the channel mode of operation, the passband of a filter is narrowed relative to the passband of the filter in the communication mode. According to another aspect of the circuit, a local oscillator is selectively phase locked to an internal clock during channel scanning and locked to the incoming signal during a communication mode operation.

14 Claims, 2 Drawing Sheets

200

APPARATUS FOR DETECTING A SIGNALING CHANNEL DURING SCANNING INCLUDING A CONTROLLED FREQUENCY CONVERTER CIRCUIT AND A CONTROLLED FILTER BANDWIDTH, AND A METHOD THEREFOR

FIELD OF THE INVENTION

The present invention relates to signaling channel identification, and more particularly, to a method and apparatus improving signaling channel identification in receivers.

BACKGROUND OF THE INVENTION

Radio frequency (RF) receivers, such as those employed in cellular radio telephone transceivers, receive signals in predetermined signaling channels. Each channel is a unique signaling frequency range. Receivers capable of receiving signals in more than one signaling channel typically identify a channel in which information is being communicated.

In cellular systems, fixed site transceivers, known as base stations, provide communications in their surrounding coverage areas, commonly referred to as cells. The base stations communicate with mobile stations in their cells through preselected signaling channels. As a mobile radiotelephone is transported by the user, it will move from cell to cell. When the mobile station moves into the coverage area of a new base station, it must identify a new signaling channel associated with that base station. To identify the channel in which a base station is transmitting signals, the mobile station scans predetermined signaling channels and identifies the two signaling channels having the most energy therein.

A difficulty encountered with existing systems is a strong signal on one channel (A in FIG. 3) will spill into adjacent channels (B and C). Accordingly, if the correct channels are channels A and D, but the received signal strength identification (RSSI) measurement for channels A and C are the largest, the receiver will erroneously select channels A and C. After the two strongest channels are identified, the cellular telephone will try to communicate over those channels. If the receiver has selected the wrong channels, it will be unable to communicate with the base station. However, it will be too late to attempt to identify other channels. This is because of the strict time limit in which the cellular telephones must lock onto the new channel to minimize any gap in service during the hand-off from an old cell to a new cell.

An additional difficulty encountered with some transceivers is that they require an oscillator having a very small tolerance (e.g., a 2.5 ppm tolerance). Oscillators with such small tolerances are very costly. However, a larger tolerance oscillator can be used as the timebase for a mobile Station transceiver if the mobile station transceiver is locked to a received signal from the base station. Such a system requires that the receiver lock onto the incoming signal before the mobile transceiver transmits signals. Thus, it is critical in such transceivers that the base station signaling, or communication, channel is accurately identified quickly.

Accordingly, there is a need for a system which will reliably and quickly identify signaling channels using energy measurements made during channel scanning.

DESCRIPTION OF THE PREFERRED EMBODIMENT

A receiver identifies signaling channel energy during a channel scanning mode. The passband of a receiver filter is narrowed and/or a local oscillator is phase locked to the receiver reference oscillator during a channel scanning mode. In a communication mode, the passband of the filter is broadened and the local oscillator is phase locked to the incoming signal. The probability that the correct signaling channels will be identified during the channel scanning mode are significantly increased without degrading receiver performance during the communication mode.

Figure 1:
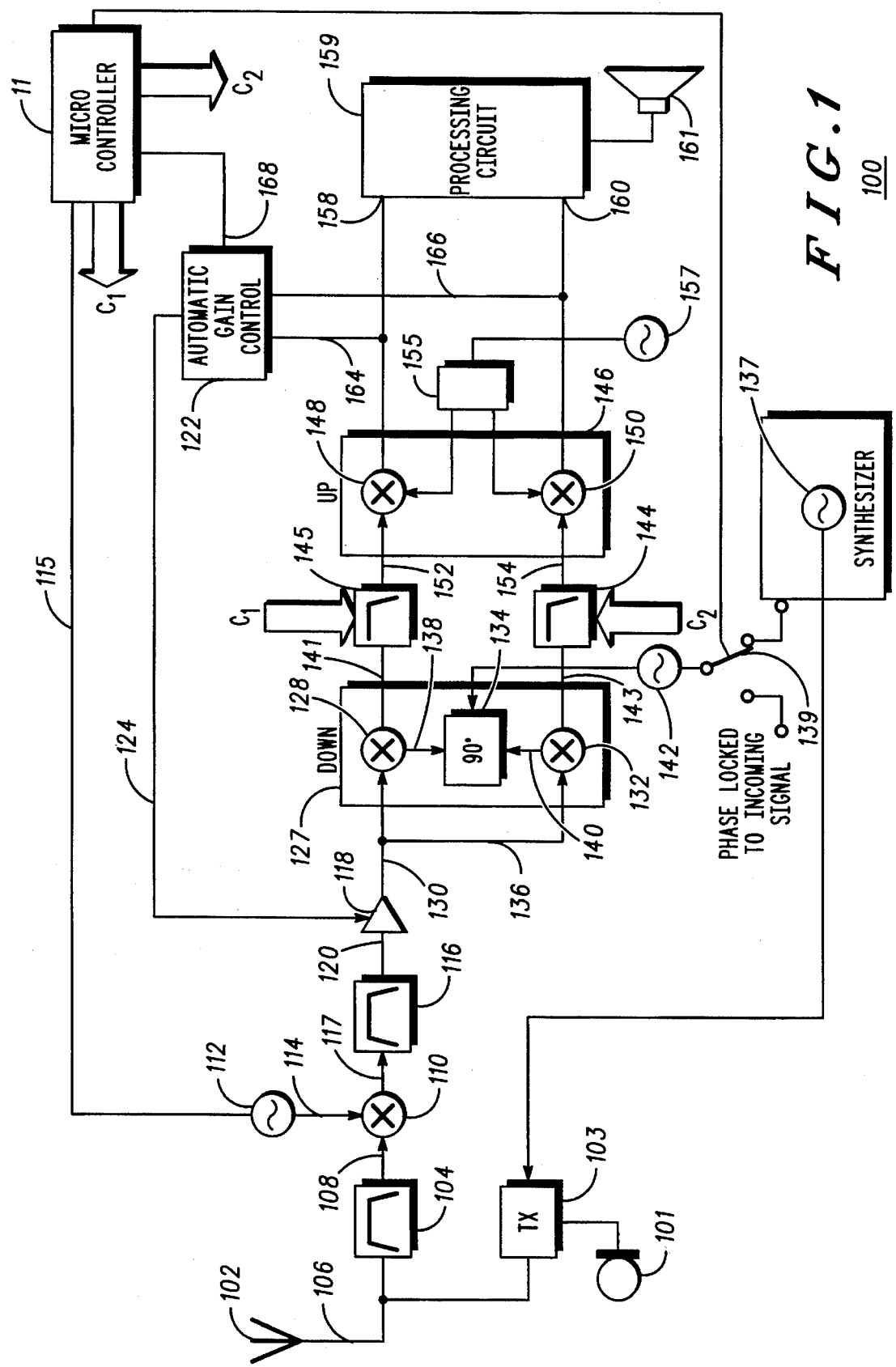
FIG. 1 is a circuit schematic illustrating a transceiver in which the present invention is embodied.

A receiver 100 in which the present invention is embodied is illustrated in FIG. 1. The receiver is coupled to an antenna 102 through which radio frequency (RF) signals are communicated. The illustrated receiver is part of a cellular telephone transceiver including a transmitter 103 connected between a microphone 101 and antenna 102. Although the receiver 100 is illustrated in a radiotelephone transceiver which communicates with base stations (not shown) via antenna 102, the present invention can be advantageously employed in other receivers, for other systems.

Receiver 100 includes a filter 104 connected to antenna 102 through a conductor 106. The filter 104 has a broad passband such that is passes all the signals in the frequency band at which compatible base stations are known to operate.

The output of filter 104 is connected to a first input of a mixer 110 through a conductor 108. The second input of mixer 110 is connected to an oscillator 112 through a conductor 114. The oscillator 112 has a control input connected to a microcontroller 113 through a conductor 115. The oscillator is a variable frequency circuit which may be implemented using any suitable circuit, such as a voltage controlled oscillator.

The output of mixer 110 is connected to an input of filter 116 through a conductor 117. Filter 116 is a crystal intermediate frequency (IF) filter having a fixed center frequency $f_c$ and a passband of approximately one channel width.

The output of the IF filter 116 is connected to a variable gain amplifier 118 through a conductor 120. The variable gain amplifier 118 has a control input connected to automatic gain control 122 through a conductor 124. The gain of the amplifier 118 is varied in proportion to the output of the receiver, in a conventional manner.

The output of amplifier 118 is connected to a down converter 127. The down converter includes an in-phase mixer 128, a quadrature mixer 132, and a quadrature generator 134. Amplifier 118 is connected to a first input of mixers 128 and 132 through conductors 130 and 136, respectively. The second inputs of mixers 128 and 132 are connected to respective outputs of quadrature generator 134 through conductors 138 and 140. The signals input to mixers 128 and 132 on conductors 138 and 140 are 90 degrees out of phase. Mixers 128 and 132 produce low frequency quadrature signals at the outputs thereof, which are 90° out of phase.

The quadrature generator includes an internal oscillator (not shown) which is locked to oscillator 142. Oscillator 142 is connected to a switch 139. Switch 139 is coupled to the output of filter 116 or a reference oscillator circuit 137. The reference oscillator circuit includes a fixed frequency oscillator having a predetermined tolerance and circuitry for generating other frequencies from the oscillator frequency. During scanning, controller 113 controls switch 139 such that oscillator 142 is phase locked to the reference oscillator. The fixed frequency signal output by oscillator 142 is set to a fixed frequency. For example, it could be set to approximately $f_c$, or $f_c+\Delta f$, wherein $\Delta f$ is a constant added to $f_c$. Thus during the channel scanning mode, the quadrature generator is locked to a fixed frequency which will not drift with the incoming signal. By locking 142 to a fixed frequency, the signals output by oscillators 128 and 132 will remain stable. Although some distortion may result from locking oscillator 142 to a reference signal, this distortion does not significantly affect the RSSI measurement.

After channel scanning is completed, and the strongest channels identified, the microcontroller 113 controls switch 139 to couple oscillator 142 for phase lock,to the incoming signal. In the communication mode state, oscillator 142 is phase locked to the strong incoming signal at the output of filter 116. By locking this oscillator to the incoming signal, distortion will not result from phase drift of the incoming signal relative to the receiver clock.

Mixers 128 and 132 are connected to filters 145 and 144 through conductors 141 and 143, respectively. Filters 145 and 144 are programmable lowpass filters. These filters are programmable to vary the passband thereof, and may be implemented using switched capacitor filters. Applicant's found that the cut-off frequency could be reduced by as much as 50%, but preferred that the cutoff be reduced by 60%.

The output of the filters are up-converted in up converter 146. The up converter includes mixers 148 and 150 connected to filters 145 and 144 by conductors 152 and 154, respectively. The mixers 148 and 150 are connected to a quadrature generator 155 connected to a local oscillator 157. In the reduction to practice, the oscillator 157 was selected such that the oscillators 148 and 150 produce an output signal having a predetermined frequency.

The outputs of the up converter 146 are connected to additional processing circuitry 159 through conductors 158 and 160. The output of the processing circuitry drives a speaker 161 in the cellular telephone.

The output of the up converters are also connected to an automatic gain control generator 122. The RSSI circuitry in detector 122 generates a DC signals on conductor 168. The RSSI signal detector uses the gain control signal and a rectifier. For low level signals, which are below a threshold level, the gain control signal for amplifier 118 is set at its maximum and has no effect on RSSI measurements. Accordingly, the RSSI output is generated entirely by the rectifier. For signals above the threshold, the RSSI signal is inversely related to the gain control signal. The signal energy detector may be implemented using any suitable signal level detecting circuitry which outputs a signal proportional to an input signal.

In one reduction to practice, filter 104 had a passband between approximately 917 MHz and 950 MHz. The frequency output of oscillator 112 was varied from 1031 MHz to 1064 MHz in 25 KHz increments (e.g., the channel width) to effect scanning. The center frequency $f_c$ of filter 116 was approximately 114 MHz and the passband of this filter was 25 KHz. It will be recognized by those skilled in the art that the 25 KHz bandwidth is selected for base stations with channels having a 25 KHz bandwidth. For base stations having channels with other bandwidths (e.g., a 30 KHz bandwidth), the passband is set to that frequency range (e.g., 30 KHz). In this reduction to practice, the cut-off frequency of the filters was programmed to be approximately 17 KHz during the communication mode, and may for example be 17.5 KHz. The cut-off frequency was significantly reduced during scanning operation to approximately 10 KHz, and could for example be 10.5 KHz. The output of the up converter was approximately 130 KHz, and could be selected to have a frequency of 131.25 KHz.

In operation, the receiver 100 in a mobile station identifies a signaling channel of a base station when the mobile station enters a new cell or before initiating a call. Prior to the scanning mode, during which the appropriate channel is detected, control signals C1 and C2 are adjusted by Signal processor 113 to lower the cut-off frequencies of low-pass filters 145 and 144, respectively. The oscillator 142 is controlled by microcontroller 113 and switch 139 to phase lock to the receivers internal clock.

After oscillator 142 and lowpass filters 144 and 145 are switched to their scanning mode state, the output of filters 144 and 145 are monitored in the scanning mode. The received signals are processed though an input circuit, including filter 104, oscillator 112 and mixer 110. The output of the input circuit is filtered by bandpass filter 116, which passes a selected channel. The channels are selected using first local oscillator 112, which is controlled to step within the signaling channel band. In the reduction to practice, the oscillator scanned from 1031 MHz to 1064 MHz in 25 KHz increments. At each increment, or step, the frequency of the signal output by filter 104 which mixes with the oscillator signal to produce a signal in the passband of filter 116, changes. Thus, the 1031 MHz oscillator signal frequency and 917 MHz input signal will produce a 114 MHz signal at the output of the filter which will pass through filter 116. At each oscillator frequency step, a different signal at the output of filter 104 will produce the signal in the passband of filter 116, and thus which will pass though the filter. Oscillator 112 and mixer 110 thus act as a variable frequency shifter which shifts one channel into the passband of filter 116. Filter 116 removes signals outside of that one channel, such that the shifter, and filter 116, act as a channel selector.

The output of the input circuit is amplified by amplifier 118. The amplifier output is coupled to a! frequency converter, or control, circuit, including down-converter 127 and up converter 146. Down converter 127 produces a low frequency in-phase component on conductor 1 41 and a low frequency orthogonal component on conductor 143. The down conversion frequency is controlled by the local oscillator, which is phase locked to the receiver clock during scanning to insure that the output of the down converter does not drift, and is thus centered, in a base station channel.

The output of the oscillator is filtered by a filter circuit including low pass filters 145 and 144. The cut-off frequency of the low pass filter is reduced in the scanning mode. The frequency of a signal output by the filter during scanning is close to the center frequency of the channel selected using the channel selector control signal on conductor 115. This reduces energy leakage from strong channels which can cause erroneous measurements in adjacent channels. The output of the filter circuit is up-converted to a predetermined frequency at output terminals 158 and 160.

Energy measurements are made by controller 113 coupled to energy detector 162. When energy is below a threshold level, such as −90 dB, the RSSI measurement is taken directly from the output of a rectifier. When the measurements exceed the threshold level, the output of the gain control signal will vary, and this varying signal and the rectifier output signal are used to measure the incoming signal level in a channel.

At the conclusion of the scanning interval, the oscillator 112 is set by controller 113 to select the two channels having the largest signal energy during the channel scanning mode. Filters 144 and 145 are controlled via control inputs C1 and C2 to have their higher, communication mode cutoff frequency. Additionally, the local oscillator 142 is switched to the communication mode, wherein it is phase locked to the incoming signal. This is because distortion introduced by the filter and the oscillator, which is phase locked to a fixed frequency, will render the transceiver virtually incapable of receiving data. By broadening the passband of filters 144 and 145, and returning the circuit to incoming signal phase lock, high quality communication will be obtained.

Applicant's recognized that the distortion introduced by locking oscillator 142 being locked to the receiver oscillator reduces the number of erroneous signal measurements. By reducing the passband of the receiver, and more particularly, filters 144 and 145, additional improvements in the accuracy of the RSSI measurement are obtained. This is because the power contained within the narrow IF bandwidth has a low data modulation index (in the reduction to practice, approximately 0.8).

Figure 2:
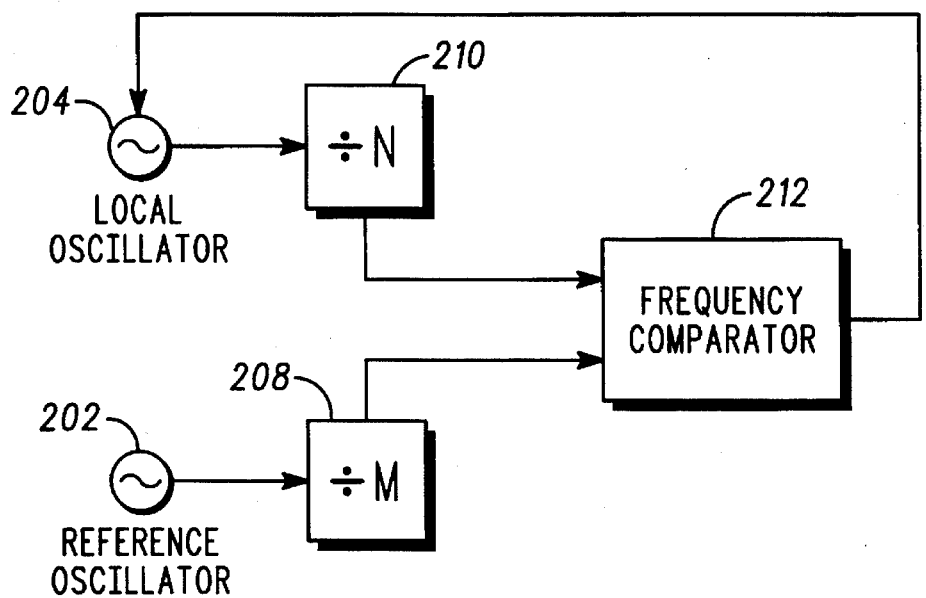
FIG. 2 is a circuit schematic of a synthesizer utilized in the transceiver according to FIG. 1.
Figure 3:
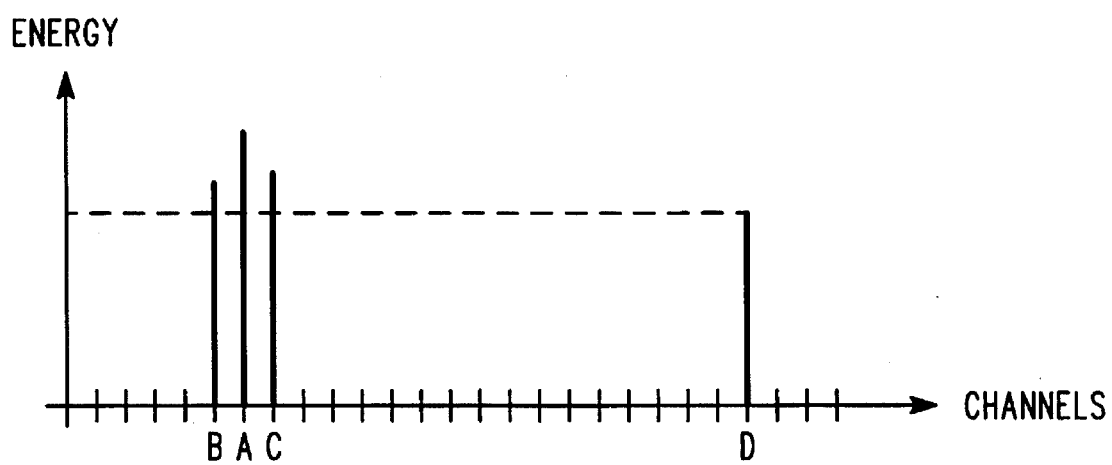
FIG. 3 is a diagram illustrating channel energy measurements made using a prior art system.

A synthesizer 200 is illustrated in FIG. 2 which controls the frequency of the local oscillators. The synthesizer includes reference oscillator 202 and local oscillator 204, which is oscillator 112, oscillator 142, and/or the transmitter oscillator (not shown). A divide-by-M divider 208 is connected to the output of the reference oscillator 202 and a divide-by-N divider 210 is connected to the output of local oscillator 204. The dividers 208 and 210 may be advantageously implemented in microcontroller 113 (FIG. 1). The reference frequency is divided down by M and the local oscillator's frequency is divided down by N, both N and M being programmable, such that they may be varied.

A frequency comparator 212! is connected to dividers 208 and 210. The comparator compares the outputs of dividers 208 and 210. The result of the comparison is an error signal which drives the tuning port of the local oscillator. The comparator 212 may be implemented using any suitable circuit. One circuit which may be used employs a phase detector having pulsed up or pulse down voltages. These voltages drive a charge pump, which converts the voltages to currents. A loop filter, which may be implemented using a low pass filter, is connected to the charge pump output The charge pump filters the pulses and converts the current pulses into a dc voltage. The dc voltage drives the local oscillator, whose output frequency is a function of this dc voltage.

To adjust the oscillator frequency, the divider 21 0 is varied until its output frequency is substantially equal to the output of divider 208 (the reference oscillator frequency divided by M). These divider output frequencies will not be exactly equal due to the limitations in the dividers, but they will be within one divider step. This reference oscillator is the reference for the frequency generation system, and is, for example a 2.5 ppm (parts per million) oscillator. If the reference oscillator is off by 2.5 ppm, then the local oscillator will be off by 2.5 ppm.

A synthesizer, such as synthesizer 200 (FIG. 2), is used to generate the transmit frequency for transmitter 103 (FIG. 1). The output of the reference oscillator 202 in the transmitter is sent to the transmit oscillator synthesizer. To improve the accuracy of the transmit signal to that of the receive frequency (which is the base station transmit signal), the reference oscillators frequency is adjusted using a suitable means, such as a DAC (digital to analog converter, not shown). The controller 113 controls the DAC to output a signal that drives a tuning line (not shown) on the reference oscillator 202. The DAC signal tunes the reference oscillator by varying the oscillator's output frequency until the mobile station's transmit frequency is substantially improved to be near the base station's transmit frequency tolerance (within the limits of the DAC). The base station's transmit frequency tolerance is learned from the signal received in the base station signaling channel, which is identified in the channel scanning mode. Consequently, a 5 ppm tolerance reference oscillator can be improved to near the base station's transmit signal frequency tolerance, which is typically approximately 0.25 ppm.

It will be recognized that the signaling channel including the base station's transmit signal is identified using either the corrected or uncorrected reference Oscillator's tolerance, depending upon whether the reference oscillator is tuned to a previous incoming signal. Only after the receive signal channel is accurately identified, is it known that the reference oscillator is tuned according to the current incoming signal (i.e., the current base station transmit signal). By narrowing the passband frequency of the receiver filter, the uncorrected higher tolerance reference oscillator may be used as a timebase for the local oscillators, while still achieving accurate identification of the signaling channels.

It is known to use the received signal in a mobile radiotelephone as the timebase for transmitter operation. This is typically done to comply with tolerance requirements for transmission signals, as the base station signals will be within the required tolerance. In such systems, before signals can be transmitted by the mobile station, the mobile station local oscillator must be locked to the received signal. However, the transceiver must accurately identify a signaling channel and receive data from the base station before the local oscillators in the transceiver are phase locked to the incoming signal. Applicant's discovered that by reducing the bandwidth of IF filter 116, and/or filters 144 and 145, the tolerance of the reference oscillator in the transceiver can be significantly loosened while significant improvements in the accuracy of the channel scanning measurements will be obtained. Thus, oscillators previously required 2.5 ppm tolerance for a channel bandwidth of 30 MHz and employed a 30 MHz bandwidth during scanning. Applicant's reduced the passband of the IF filter to 20 to 60% of its original bandwidth (e.g., to 10 MHz), increased the oscillator tolerance (e.g., to 5 to 10 ppm), and surprisingly obtained significant improvements in scanning accuracy. This permits a high tolerance oscillator, such as a 5 ppm to 10 ppm oscillator, to be used as the reference oscillator for the transceiver, thereby achieving a significant cost reduction.

The present invention overcomes the difficulties encountered by prior art systems by eliminating measuring errors caused by signaling energy spilling into adjacent channels. More specifically, according to one aspect of applicant's invention, the receiver is phase locked to a fixed frequency during scanning (e.g., the local oscillator is phase locked to a signal of $f_c + \Delta f$). According to another aspect of the immediate invention, the frequency bandwidth of the receiver is narrowed during scanning, by controlling the cutoff frequency of a low pass filter or narrowing the passband of an IF bandpass filter during channel scanning.

We claim:

1. An apparatus which communicates via RF signals on signaling channels identified in a scanning mode, scanning performed when the apparatus is turned on and selectively during communication, the apparatus receiving the RF signals at an input in a communication mode, and the apparatus including a channel selection signal which controls changing of channels during the scanning mode, the apparatus comprising:

a local reference oscillator circuit generating a signal at a predetermined local reference frequency;

a frequency converter circuit coupled to the input and to the local reference oscillator circuit, the frequency converter circuit to selectively alter the frequency of the RF signals at the input, the frequency converter circuit including a control input for receipt of a mode control signal, the frequency converter circuit responsive to the mode control signal for altering the frequency of the RF signals at the input according to the phase of the RF signals at the input or according to the phase of the predetermined local reference frequency depending upon the mode control signal;

a filter circuit coupled to the frequency converter circuit, the filter circuit having an adjustable passband which is varied responsive to a passband control signal input thereto;

a signal energy measurement circuit coupled to the filter circuit to identify signal channel energy; and a controller coupled to the signal energy measurement circuit and generating the mode control signal, the channel selection signal, and the passband control signal, the controller controlling the passband control signal such that the passband of the filter is of a first broad passband and the controller changing the mode control signal to control the frequency converter circuit to alter the RF signals at the input according to the phase of the RF signal at the input during a communication mode, and the controller controlling the filter circuit to narrow the passband of the filter circuit to a second narrower passband and controlling the frequency converter circuit to alter the RF signals at the input according to the phase of the predetermined local reference frequency during the scanning mode, whereby signal energy measurements made by the signal energy measurement circuit are improved during the scanning mode.

2. The apparatus as defined in claim 1, wherein the filter circuit includes a bandpass filter, the passband of which is narrowed during scanning.

3. The apparatus as defined in claim 1, wherein the filter circuit includes a lowpass filter, and the passband control signal changes the cut-off frequency of the lowpass filter.

4. The apparatus as defined in claim 3 further including a bandpass filter coupled to the input circuit and having a passband substantially equal to a bandwidth of the signaling channels.

5. The apparatus as defined in claim 1, wherein the frequency converter circuit includes a down converter.

6. The apparatus as defined in claim 5, wherein the frequency converter circuit includes an up converter, and wherein the filter circuit includes a filter connected between the down converter and the up converter.

7. The apparatus as defined in claim 1, wherein the frequency converter circuit is connected between the input and the filter circuit.

8. The apparatus as defined in claim 7, further including a mixer connected between the frequency converter circuit and the input, the mixer coupled to the controller to receive the channel selection signal therefrom.

9. The apparatus as defined in claim 1, wherein the controller circuit identifies the two signaling channels having the most power using energy measurements from the signal energy measurement circuit.

10. A method of controlling a radio telephone transceiver to evaluate different channels during radiotelephone communication over a current channel used in a communication mode and to change from the current channel when required during communication, the transceiver including a frequency converter including an oscillator for adjusting the incoming signal, the method comprising the steps of:

selectively controlling the receiver to enter a scanning mode during communication;

controlling the oscillator to unlock from the incoming signal to the transceiver and to lock to a predetermined local reference frequency upon entering the scanning mode;

controlling the channel selector to scan through channels in the scanning mode;

measuring the power of incoming signals while scanning the channels in the scanning mode;

selecting a signal channel during the scanning mode according to the channel having the most power measured during the scanning mode; and controlling the oscillator to unlock from the predetermined local reference frequency and to lock to the incoming signals in the channel selected during the scanning mode.

11. The method as defined in claim 10, further including the step of selecting a cutoff frequency for a lowpass filter that filters the incoming signal when scanning through the channels.

12. The method as defined in claim 10, further including the step of bandpass filtering the incoming signal prior to measuring.

13. The method as defined in claim 10, wherein the transceiver includes a filter having a programmable passband, the energy in the signal output by the filter being measured in said step of measuring, the method including the steps of:

controlling the passband of the filter to be relatively narrow during the scanning mode; and controlling the passband of the filter to be a relatively broad during the communication mode.

14. A cellular telephone having a scanning mode to identify a signaling channel of a base station and a communication mode for communicating over the identified base station channel, comprising:

an antenna;

a transmitter coupled to the antenna:

a receiver coupled to the antenna, the receiver including
an input circuit coupled to the antenna for receiving an RF signal therefrom and a channel selector signal, the input circuit outputting a signal dependent upon the channel selector signal;
a frequency converter coupled to the input circuit the frequency converter including an oscillator selectively locked to one of an incoming signal and a predetermined local reference frequency according to a mode control signal;

a filter coupled to the frequency converter, wherein the filter is controlled to have a first passband or a second passband according to a bandwidth control signal, the second passband being substantially broader than the first bandwidth;

a signal level measuring circuit receiving a signal filtered by the filter and frequency adjusted by the frequency converter and responsive thereto for outputting a power measurement; and a controller coupled to the signal level measuring circuit and generating the mode control signal, the channel selector signal, and the bandwidth control signal, the controller controlling the filter circuit to have the first passband and controlling the oscillator to lock to the incoming signal during a communication mode, and controlling the filter circuit to have the second narrower bandwidth and controlling the frequency converter to lock to the predetermined local reference frequency during the scanning mode to improve power measurements by the signal energy measurement circuit during the channel scanning mode.

* * * * *